United States Patent [19]
Teng

[11] Patent Number: 5,028,980
[45] Date of Patent: Jul. 2, 1991

[54] TRENCH CAPACITOR WITH EXPANDED AREA

[75] Inventor: Clarence W. Teng, Plano, Tex.

[73] Assignee: Texas Instruments Incorporated, Dallas, Tex.

[21] Appl. No.: 518,276

[22] Filed: Apr. 27, 1990

Related U.S. Application Data

[63] Continuation of Ser. No. 287,761, Dec. 21, 1988, abandoned.

[51] Int. Cl.$^5$ ............... H01L 29/68; H01L 27/02; H01L 29/06
[52] U.S. Cl. ............................ 357/51; 357/23.6; 357/55; 357/56
[58] Field of Search ............... 357/23.6, 55, 51, 56; 365/182

[56] References Cited

U.S. PATENT DOCUMENTS

| | | | |
|---|---|---|---|
| 4,252,579 | 2/1981 | Ho et al. | 357/23.6 |
| 4,591,947 | 5/1986 | Bagley et al. | 361/310 |
| 4,672,420 | 12/1987 | Miura et al. | 357/23.6 |
| 4,816,884 | 3/1989 | Hwang et al. | 357/55 |
| 4,830,978 | 5/1989 | Teng et al. | 357/23.6 |
| 4,843,025 | 6/1989 | Morita | 357/23.6 |
| 4,873,560 | 10/1989 | Sunami et al. | 357/23.6 |

FOREIGN PATENT DOCUMENTS 62-140456 12/1987 Japan .................. 357/236

Primary Examiner—J. Carroll
Attorney, Agent, or Firm—Douglas A. Sorensen; James T. Comfort; Melvin Sharp

[57] ABSTRACT

A trench capacitor (10) has a center portion (26) formed from the substrate (14) by a tubular trench (24). A conducting layer (32) is deposed within the tubular trench (24) and is separated from the substrate (14) and center portion (26) by a dielectric layer (30). Since the charge storage area and the trench capacitor (10) includes both the inside and outside of the trench (24), a greater surface area is obtained, thereby increasing the capacitance of the device. A memory cell (34) may be implemented using the capacitor (10).

8 Claims, 2 Drawing Sheets

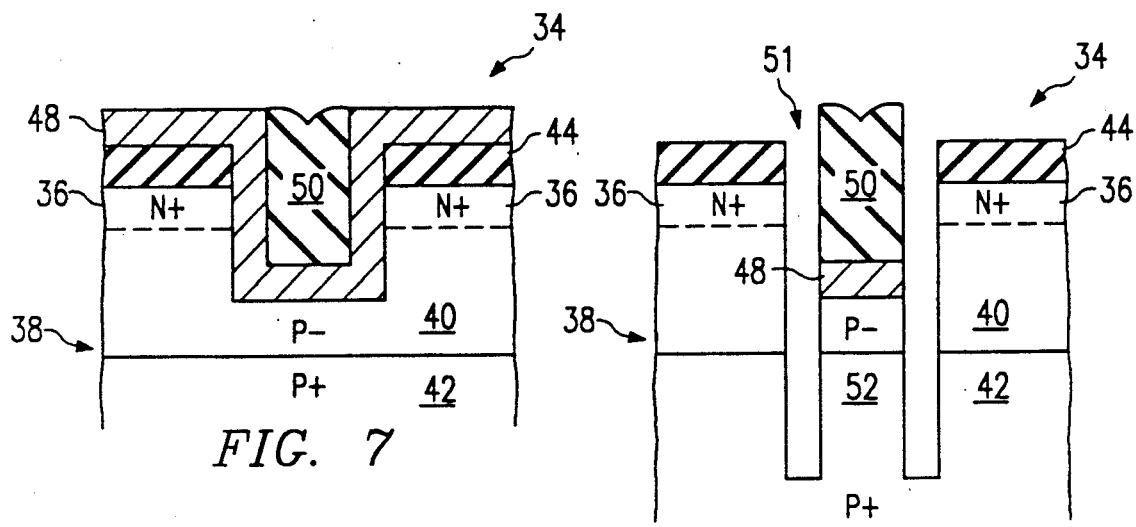
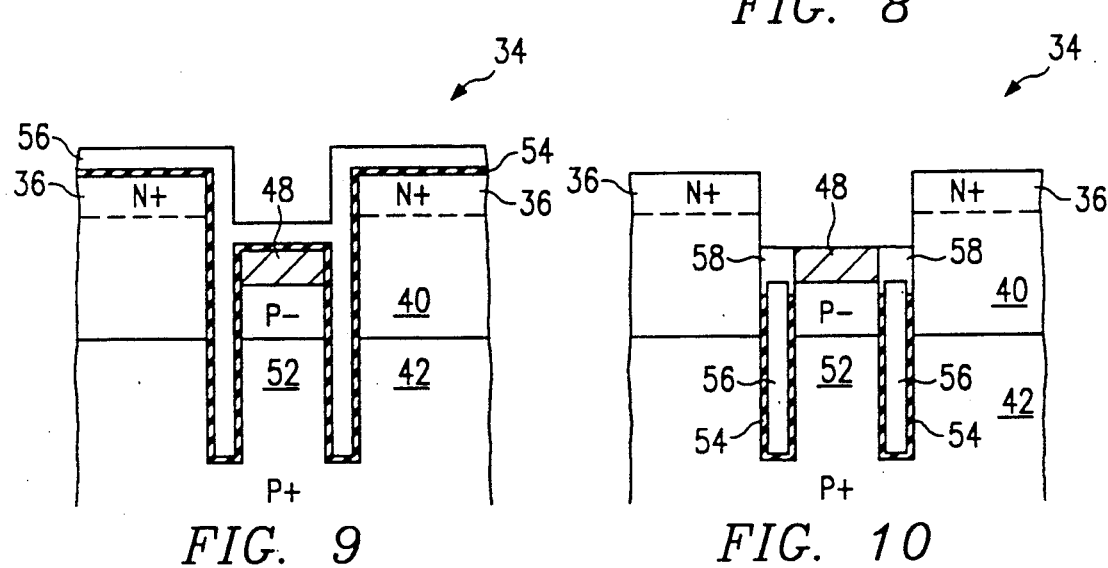
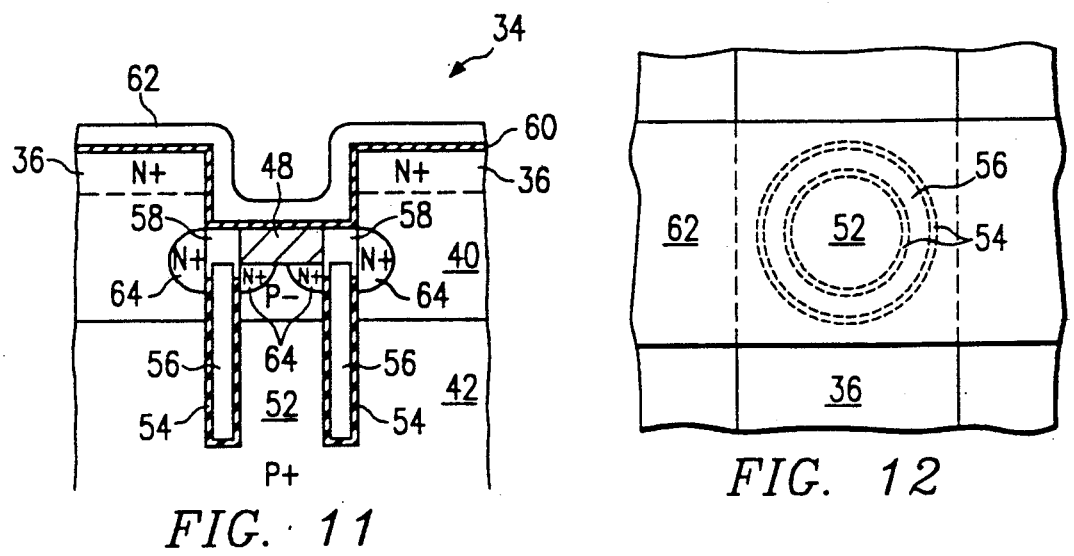

TRENCH CAPACITOR WITH EXPANDED AREA

This application is a continuation of application Ser. No. 287,761, filed Dec. 21, 1988, abandoned.

TECHNICAL FIELD OF THE INVENTION

This invention relates in general to integrated circuits, and more particularly to an improved trench capacitor having an expanded area between its plates.

BACKGROUND OF THE INVENTION

As the density of dynamic RAMs increases, it is necessary to use trench capacitors for charge storage. A dynamic memory cell using trench capacitors is disclosed in U.S. patent application Ser. No. 212,452 by Teng and filed on June 28, 1988, U.S. Pat. No. 4,958,206 which is incorporated herein by reference. A dynamic memory cell using a trench transistor is disclosed in U.S. patent application Ser. No. 026,356 by Teng, et al., filed Mar. 16, 1987, entitled "DRAM Cell and Method," U.S. Pat. No. 4,830,978, which is also incorporated by reference herein. Using a five volt supply, a 40 fF capacitor is necessary, resulting in a 200 fF capacitance. As memory cell size is decreased, however, a 3.3 volt, or lower, voltage supply will be used, thereby requiring a capacitance of at least 60 fF.

Present day trench capacitors are formed etching a trench in the substrate (the substrate acts a first plate of the capacitor), forming a dielectric layer along the sidewall of the trench, and refilling the trench with polysilicon (which acts as the second plate of the capacitor). The capacitance of present day trench capacitors may be increased by increasing the trench depth. However, it is difficult to achieve trenches with a true 90° angle; therefore, for a given diameter, the depth which may be achieved is limited. For example, for a 1 micrometer trench, the trench depth is limited to approximately 6 micrometers for an sidewall angle of 85° and approximately 9.5 micrometers for an sidewall angle of 87°. More importantly, the increase in surface area between the plates is not significant when the depth is greater than 6 micrometers. For example, only a 15% increase in surface area (and hence capacitance) can be obtained when the depth is increased from 6 micrometers to 9 micrometers for a given angle.

A true vertical trench (90°) may be possible. However, the profile of the trench may result in void formation during the polysilicon refill. The formation of voids within the trench may be fatal to the DRAM devices. The maximum trench angle which can be void-free is not known.

As memory devices become denser, the size of trench is used to form the capacitors must also decrease. Hence, it is necessary to provide more capacitor (because of the smaller volt supply) in a smaller trench (because of the size limitations).

Therefore, a need has arise in the industry for a trench capacitor having increased capacitance in a smaller area.

SUMMARY OF THE INVENTION

In accordance with the present invention, a trench capacitor, and method of forming the same, is provided which substantially eliminates the disadvantages associated with present day trench capacitors.

The trench capacitor of the present invention comprises a semiconductor center portion formed within the substrate. A first insulating layer separates the semiconductor center portion from a electrically conducting layer. A second insulating layer separates the electrically conducting layer from the substrate. Typically, the semiconductor center portion comprises the substrate material. With the center portion and the substrate acting as a first plate and the electrically conducting layer, typically polysilicon, acting as the second plate, the surface area between plates can be almost doubled in respect to present day trench capacitors.

The trench capacitor of the present invention may be formed by forming a first mask, typically an oxide mask, defining the outside periphery of a tubular trench, and forming a layer of selectively etchable material, such as polysilicon, over the first mask. A second mask, again typically oxide, is formed over the selectively etchable layer and is etched back to expose the vertical sidewalls of the etchable layer. The vertical sidewalls of the etchable material are anisotropically etched along with the semiconductor substrate therebelow to form a tubular trench. A dielectric is formed on the sidewalls of the trench and doped polysilicon is deposited in the trench to form the second plate.

The present invention provides the technical advantage of increased surface area between the plates to effectively double the capacitance of the trench capacitor. Therefore, a smaller area may be used to provide a larger capacitance.

BRIEF DESCRIPTION OF THE DRAWINGS

For a more complete understanding of the present invention and for further advantages thereof, reference is now made to the following Detailed Description, taken in conjunction with the accompanying drawings, in which:

FIG. 7 illustrates a cross-sectional side view of a trench-transistor DRAM cell using the trench capacitor of the present invention after a second processing stage;

FIG. 8 illustrates a cross-sectional side view of a trench-transistor DRAM cell using the trench capacitor of the present invention after a third processing stage;

FIG. 9 illustrates a cross-sectional side view of a trench-transistor DRAM cell using the trench capacitor of the present invention after a fourth processing stage;

FIG. 10 illustrates a cross-sectional side view of a trench-transistor DRAM cell using the trench capacitor of the present invention after a fifth processing stage;

FIG. 11 illustrates a cross-sectional side view of a trench-transistor DRAM cell using the trench capacitor of the present invention after a sixth processing stage; and FIG. 12 illustrates a top plan view of a trench-transistor DRAM cell using the trench capacitor of the present invention.

DETAILED DESCRIPTION OF THE INVENTION

The preferred embodiment of the present invention is best understood by referring to FIGS. 1-12 of the drawings, like numerals being used for like and corresponding parts of the various drawings.

Figure 1:
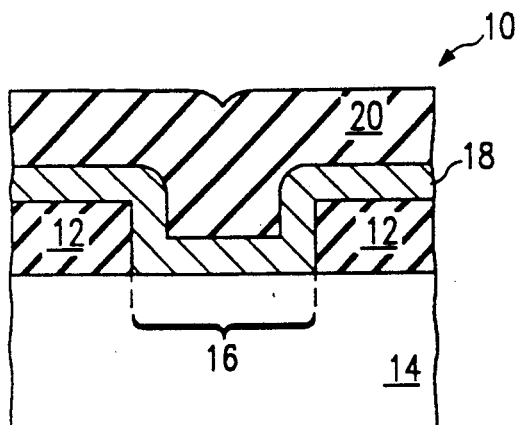
FIG. 1 illustrates a cross-sectional side view of the trench capacitor of the present invention after a first processing stage.

FIG. 1 illustrates a cross-sectional side view of the trench capacitor of the present invention after a first processing stage. The trench capacitor is generally referred to by reference numeral 10. A first oxide layer 12 is formed over a semiconductor substrate 14. The oxide layer 12 is patterned and etched to expose a portion of the substrate 14 defining the outer periphery 16 of the trench capacitor 10. The photoresist used to mask the oxide layer 12 is removed and a polysilicon or amorphous silicon layer 18 is deposited over the first oxide layer 12 and exposed substrate using low pressure chemical vapor deposition (LPCVD) techniques. A second oxide layer 20 is deposited over the polysilicon layer 18.

Figure 2:
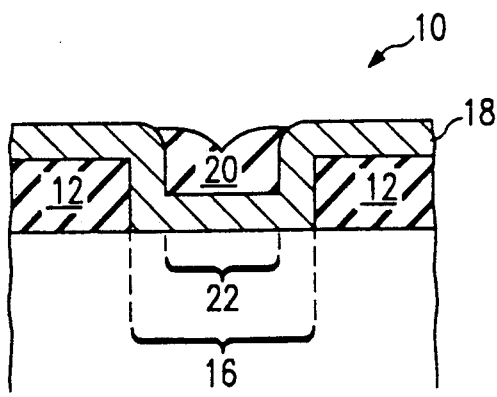
FIG. 2 illustrates a cross-sectional side view of the trench capacitor of the present invention after a second processing stage.

FIG. 2 illustrates the trench capacitor of the present invention after a second processing stage. The second oxide layer 20 is etched back to expose the polysilicon layer 18. Hence, a mask is formed between the first and second oxide layers 12 and 20 such that the first oxide layer 12 defines the outer periphery 16 of a trench and the second oxide layer 20 and polysilicon 18 define the inner periphery 22 of a trench.

Figure 3:
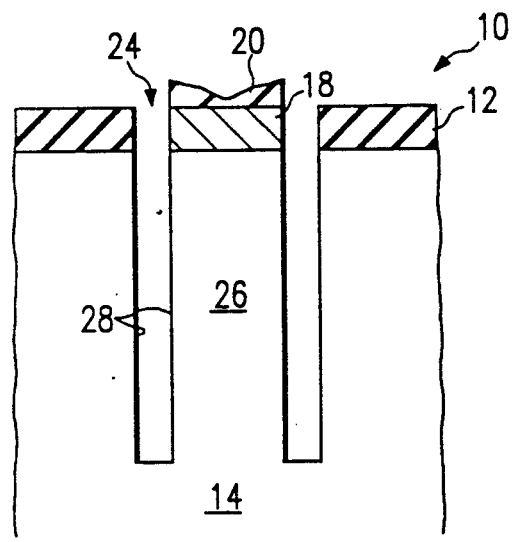
FIG. 3 illustrates a cross-sectional side view of the trench capacitor of the present invention after a third processing stage.

FIG. 3 illustrates a cross-sectional side view of the trench capacitor 10 after a third processing stage. A trench etch is performed, using an etch which will remove the polysilicon (or amorphous silicon) layer 18, but not the first or second oxide layers 12 or 20. The etch must be anisotropic, such that the exposed portions of the polysilicon 18 are removed and the portions of the substrate 14 directly under the vertical portions of the polysilicon 18 also removed to a predetermined depth. Hence, a tubular trench 24 is formed in the substrate 14 defining a center portion 26 carved out of the substrate. At this point, the trench sidewalls 28 may be doped using standard techniques, if necessary.

Figure 4:
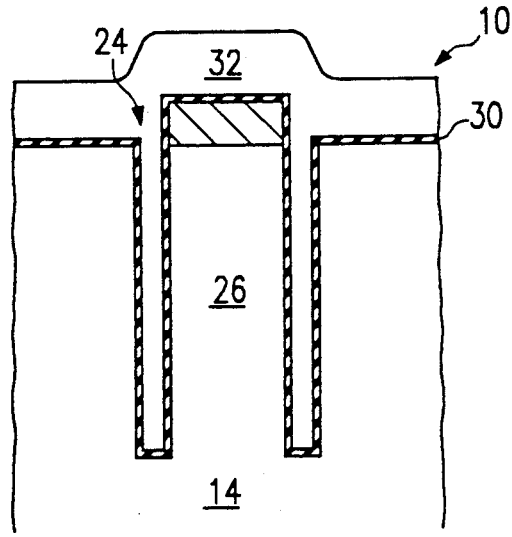
FIG. 4 illustrates a cross-sectional side view of the trench capacitor of the present invention after a fourth processing stage.

FIG. 4 illustrates the trench capacitor 10 of the present invention after a fourth processing stage. The oxide layers 12 and 20 are removed using either a wet chemical etch or a plasma etch. A capacitor dielectric 30 is formed over the device, typically using thermal oxide techniques. Typically, the capacitor dielectric 30 has a thickness of approximately 100-200 angstroms. Using LPCVD techniques, a polysilicon layer 32 is formed within the tubular trench 24, and over the device if desired.

Figure 5:
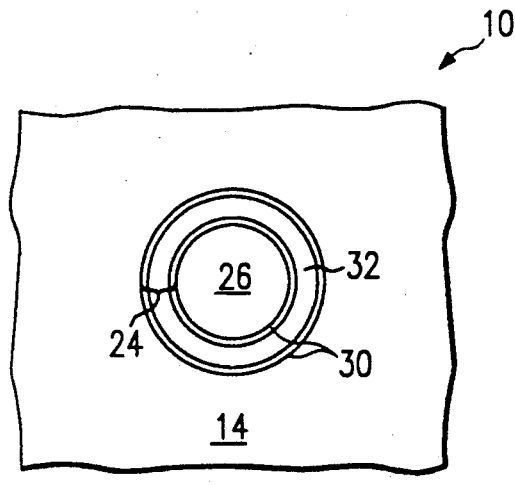
FIG. 5 illustrates a top plan view of the trench capacitor of the present invention after the fifth processing stage.

FIG. 5 illustrates a top view of the capacitor of the present invention showing the tubular nature of the device. While the tubular trench 24 is shown as being substantially circular in nature, it should be noted that the tubular trench 24 could be of any geometry, "tubular" being used in the specification along to denote a trench with an inner and outer periphery.

As can be seen from FIGS. 4 and 5, the charged storage area in the trench capacitor 10 of the present invention includes both the inside and the outside of the tubular trench 24. As the thickness of the tubular trench 24 approaches zero, the total capacitive area approaches two times that obtained with conventional trench capacitors. For example, assuming a trench capacitor with an outer periphery of 1 micrometer, and a tubular trench thickness of 0.1 micrometer, the total capacitive area is 1.8 times larger than could be obtained with a prior art trench capacitor. Also, since the actual trench opening is only a fraction of that used with conventional trench capacitors, the trench is easier to refill, and voids are not a significant problem.

It should be noted that while the mask used for forming the tubular trench 24 is shown as first and second oxide layers 12 and 20 with an intermediate layer of polysilicon 18, other materials could be used with the same effect. The intermediate layer 18 must be etchable selective to the inner and outer masks 12 and 20. The inner and outer masks 12 and 20 should be "hard" masks, i.e., able to withstand a relatively long period of etching in order to render a deep tubular trench 24.

The trench capacitor 10 of the present invention provides significant advantages over the prior art. The trench capacitor of the present invention increases capacitance without using a deeper trench or a larger device area. The trench profile may be vertical or even retrograde without significant problems.

FIGS. 6-12 illustrate the use of the trench capacitor 10 of the present invention in the implementation of a trench-transistor DRAM cell. Trench-transistor DRAM cells in general are discussed in detail in U.S. patent application Ser. No. 026,356 to Teng filed on Mar. 16, 1987; which is incorporated by reference herein.

Figure 6:
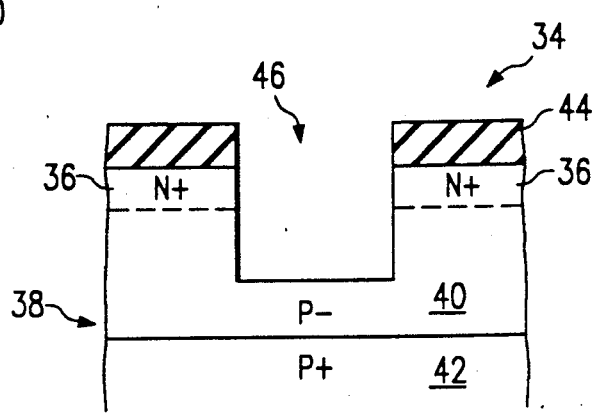
FIG. 6 illustrates a cross-sectional side view of a trench-transistor DRAM cell using the trench capacitor of the present invention after a first processing stage.

FIG. 6 illustrates a cross-sectional side view of the memory cell 34 after a first processing stage. An N+ diffused layer 36 is formed in a substrate 38 comprising a P— epitaxial layer 40 and a P+ layer 42. A first oxide layer 44 is formed over the top of the substrate 38. The first oxide layer 44 is patterned using photoresist as discussed in connection with FIG. 1. However, rather than removing only the unmasked portion of the first oxide layer 44 to define an outer periphery mask as shown in FIG. 1, the underlying substrate is also removed to form a cavity 46 in the P-epitaxial layer 40. Typically, the cavity 46 has a depth of approximately 2 micrometers.

FIG. 7 illustrates a cross-sectional side view of the memory cell 34 after a second processing stage. The resist used to mask the first oxide layer 44 is removed and a polysilicon layer 48 (or amorphous silicon layer) is deposited over the structure using LPCVD techniques. A second oxide layer 50 (or other suitable hard mask material) is deposited over the polysilicon layer 48. The second oxide layer 50 is etched back to form a mask within the cavity 46.

FIG. 8 illustrates a cross-sectional side view of the memory cell 34 after a third processing stage. The trench etch is performed, using an anisotropic etching technique. The polysilicon layer 48 is removed, along with the portions of the substrate 38 underlying the vertical portions of the polysilicon layer 48. As a result, a tubular trench 51 is formed creating a center portion 52 carved out of the substrate 38.

In FIG. 9, the memory cell 34 of the present invention is illustrated after a fourth processing stage. The oxide layers 44 and 50 are removed using a chemical etch (for example, an HF solution) or with a plasma etch (for example, $C_2F_6/CHF_3$). Thereafter, the capacitor dielectric 54 is grown on the sidewalls of the tubular trench 51 as previously described in connection with FIG. 4. An N+ doped polysilicon layer 56 is deposited in situ over the device to refill the trench 51.

FIG. 10 illustrates a memory cell 34 of the present invention after a fifth processing stage. The doped polysilicon layer 56 is etched isotropically (for example, in a CF$_4$/O$_2$ plasma) to a point slightly below the top of the center portion 52. The oxide layer 54 is deglazed, to a point approximately 0.3 micrometers below the top of the center portion 52, using a suitable solution such as HF. A layer of undoped polysilicon is formed over the device and isotropically etched back to form undoped poly regions 58.

A cross-sectional side view of the memory cell 34 of the present invention is illustrates in FIG. 11. A gate oxide 60 is grown over the device and a polysilicon layer 62 is deposited over the gate oxide 60. The polysilicon layer 62 is etched to form wordlines. The device is annealed to drive dopants from the doped polysilicon layer 56 through the undoped poly regions 58 to form diffused regions 64 in the P− epitaxial layer 40 and in the center portion 52. Typically, annealing is performed at 900° C. in an inert ambient such as nitrogen gas. Hence, a vertical transistor is formed between N+ regions 36 and 64 such that charge can be stored in the doped polysilicon layer 56.

FIG. 12 illustrates a top plan view of the memory cell of the present invention. As can be seen, the N+ regions 36 implement bitlines and the polysilicon layer 62 provides wordlines to the trench capacitor of the present invention.

The memory cell of the present invention provides significant advantages over the prior art. Since a trench capacitor having a sufficient capacitive value may be formed in a smaller area, the memory cell 34 can be packed more densely, providing a larger memory array. Furthermore, for reasons cited in connection with the trench capacitor, the design of the memory cell will have highly reliability.

Although the present invention has been described in detail, it should be understood that various changes, substitutions and alterations can be made herein without departing from the spirit and scope of the invention as defined by the appended claims.

What is claimed is:

1. A capacitor comprising:
   a conductive substrate;
   a tubular shaped trench formed in said conductive substrate, said tubular shaped trench extending into the surface of said substrate, and, said tubular shaped trench having inside, outside and bottom surfaces said inside surface of said trench defined by a post extending from said bottom surface toward said surface of said substrate, said post including a portion of said conductive substrate remaining after forming said trench;
   a dielectric layer formed on said inside, bottom and outside surfaces of said trench; and
   a conductive layer formed in said trench, said conductive layer serving as one plate of said capacitor and said conductive substrate defining said inside, outside and bottom surfaces of said trench serving as the other plate of said capacitor.

2. A capacitor as in claim 1 wherein said dielectric layer is silicon dioxide.

3. A capacitor as in claim 1 wherein said conductor comprises polycrystalline silicon.

4. The capacitor of claim 1 wherein the cross-sectional shape of said trench is substantially circular.

5. A memory cell comprising:
   a substrate having a first conductivity type and a surface, said substrate, including a first area, said first area having a top surface being below the adjacent portion of said surface of said substrate;
   a tubular shaped trench formed in said substrate, said tubular shaped trench extending into said surface of said substrate and said trench surrounding said first area, said trench having inside, outside and bottom surfaces, said inside surfaces of said trench defined by a post extending from said bottom surface toward said top surface, said post including a portion of said conductive substrate remaining after forming said trench;
   a dielectric layer formed on said inside, outside and bottom surfaces of said trench;
   a conductive layer formed in said trench;
   a first doped region having a second conductivity type, said first doped region formed adjacent to said trench below said surface of said substrate, said first doped region being in conductive contact with said conductive layer;
   a second doped region having said second conductivity type, said second doped region formed adjacent to said trench and adjacent to said surface of said substrate, said second doped region being spaced from said first doped region defining a channel region therebetween; and
   a gate formed substantially below said surface of said substrate and above said top surface of said first area, said gate controlling the conductivity of said channel region.

6. A memory cell as in claim 5 wherein said dielectric layer is silicon dioxide.

7. A memory cell as in claim 5 wherein said conductor comprises polycrystalline silicon.

8. The memory cell of claim 5 wherein the cross-sectional shape of said trench is substantially circular.

* * * * *